United States Patent [19]
Sullivan et al.

[11] Patent Number: 5,889,658
[45] Date of Patent: Mar. 30, 1999

[54] PACKAGE ASSEMBLY FOR AN ELECTRONIC COMPONENT

[75] Inventors: Paul L. Sullivan, Phoenix; Robert W. Kamb, Gilbert; John W. Hart, Jr., Mesa; David J. Dougherty, Tempe, all of Ariz.

[73] Assignee: Motorola, Inc., Schaumburg, Ill.

[21] Appl. No.: 977,601

[22] Filed: Nov. 25, 1997

[51] Int. Cl.⁶ .................................................. H01L 23/48
[52] U.S. Cl. ......................... 361/773; 361/772; 361/813; 257/692; 257/696
[58] Field of Search .................................. 361/772–774, 361/813; 257/692, 696, 693

[56] References Cited

U.S. PATENT DOCUMENTS

| | | | |
|---|---|---|---|
| 5,019,746 | 5/1991 | Merg | 257/696 |
| 5,444,294 | 8/1995 | Suzuki | 257/666 |
| 5,659,950 | 8/1997 | Adams et al. | 29/827 |

FOREIGN PATENT DOCUMENTS

| | | | |
|---|---|---|---|
| 1-313965 A | 12/1989 | Japan | 257/696 |
| 4-003452 A | 1/1992 | Japan | 257/696 |
| 5-013646 A | 1/1993 | Japan | 257/696 |
| 5-166984 A | 7/1993 | Japan | 257/692 |

*Primary Examiner*—Leo P. Picard
*Assistant Examiner*—John B. Vigushin
*Attorney, Agent, or Firm*—Sharon K. Coleman

[57] ABSTRACT

A package assembly (70) for encapsulating and vertically surface mounting a semiconductor device such as an accelerometer includes a semiconductor device (40), a package (44) enclosing the semiconductor device, and a plurality of leads (16, 18) protruding from the package. The plurality of leads are formed from a common leadframe (10) and an internal portion of a first lead of the plurality of leads is offset from a common plane corresponding to the common leadframe prior to forming any of the plurality of leads. The offset lead increases the rigidity and vibration-resistance of the package assembly.

8 Claims, 2 Drawing Sheets

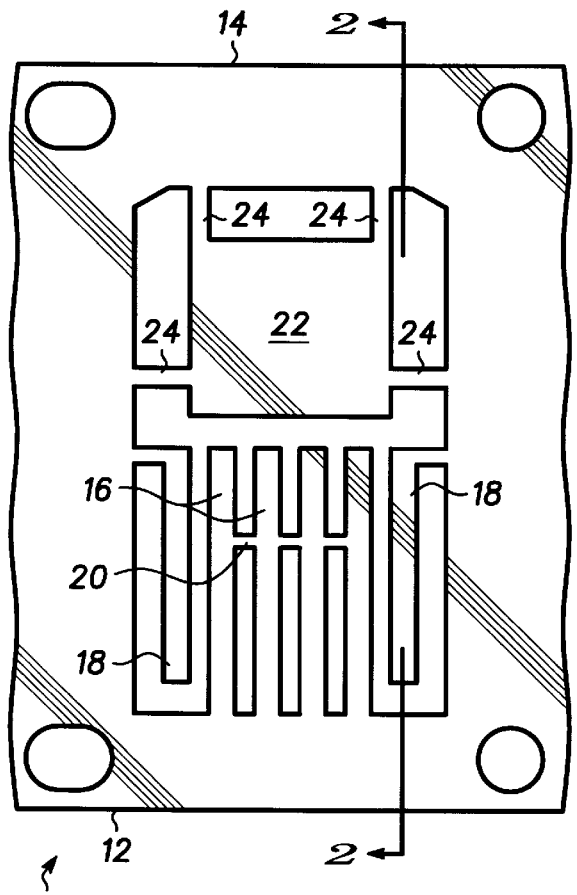
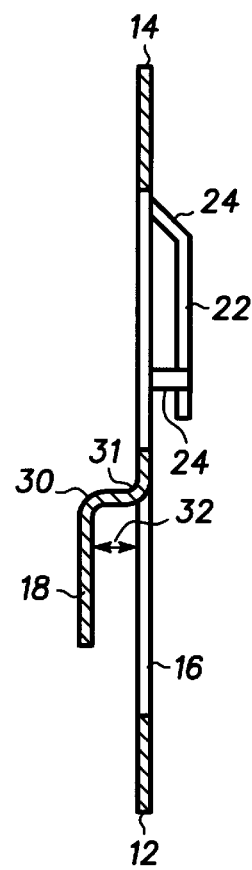
FIG. 1
FIG. 2
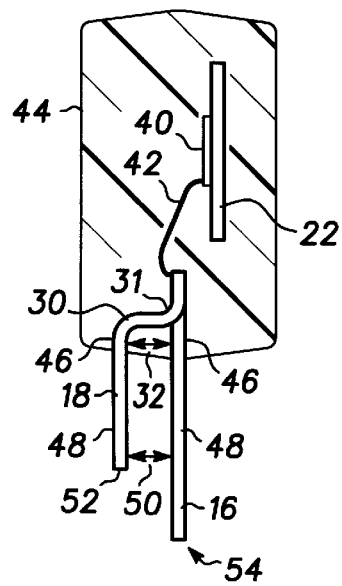
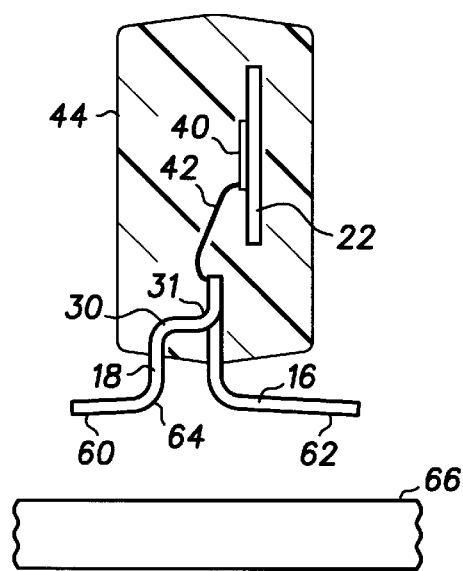
FIG. 3
FIG. 4

PACKAGE ASSEMBLY FOR AN ELECTRONIC COMPONENT

BACKGROUND OF THE INVENTION

The present invention relates, in general, to a package for an electronic component and, more particularly, to such a package having at least one offset lead.

An electronic component such as a sensor formed on a semiconductor die requires some final package to encapsulate and protect the component. The package protects the die from adverse environmental elements such as humidity or corrosive chemicals. Typically, the final package containing a sensor is mounted to a printed circuit board for electrical connection to other circuit elements in a final sensing application.

In the case of certain sensors, such as accelerometers, it is further desirable that the final package used to mount the accelerometer to the printed circuit board provide resistance against the vibratory environment of the application. This is important for an accelerometer because excessive sensitivity to vibration of low frequencies, such as might occur in an automotive application, can lead to false activation of an air bag electrically coupled to the accelerometer. Prior packages have used external supports protruding from the package and mounting to the printed circuit board to increase the rigidity of the mounted package structure. However, it would be desirable to have a rigidly-mounted package that does not require such extensive external supports. These external supports increase the difficulty of manufacture of the final packaged product and increase the footprint or surface area required to mount the package to the printed circuit board.

The prior packages noted above provide the accelerometer die with a vertically-mounted orientation relative to the printed circuit board, as is necessary for certain air-bag applications in current automotive side-door applications. It is further desirable to have an improved package for a sensor that permits vertical mounting of a die while removing the external supports required on the prior packages.

Accordingly, there is a need for an improved package for a semiconductor die that provides improved rigidity without the use of external supports and further provides the capability to mount the die with a vertical orientation.

BRIEF DESCRIPTION OF THE DRAWINGS

The present invention will be hereinafter described with reference to the drawing figures, wherein like numerals denote like elements or steps and wherein:

FIG. 1 is a top orthogonal view of a portion of a leadframe prior to the forming of any leads or assembly of the package;

FIG. 2 is a cross-sectional view taken as indicated in FIG. 1 of the leadframe after at least one of the leads is offset;

FIG. 3 is a cross-sectional view of a next stage in the manufacture of the package assembly of FIG. 5;

FIG. 4 is a cross-sectional view of the package assembly of FIG. 5;

DETAILED DESCRIPTION OF THE DRAWINGS

Figure 5:
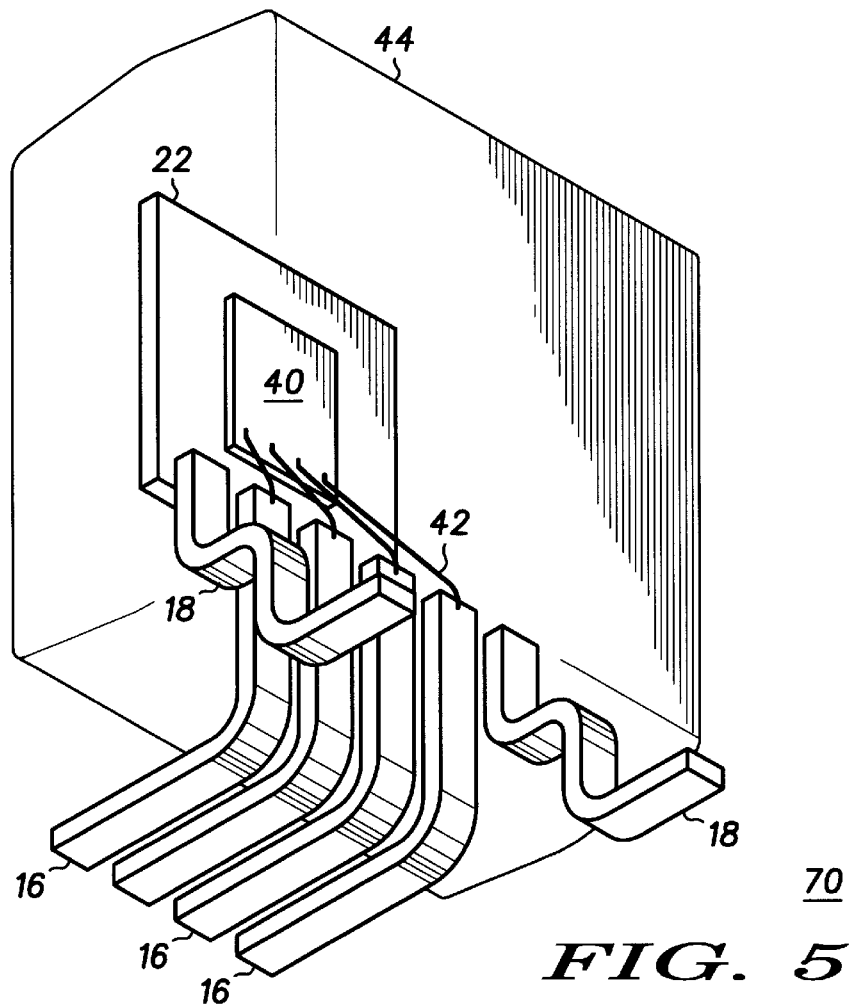
FIG. 5 is an isometric view of a package assembly for an electronic component according to the present invention.

FIG. 1 is a top orthogonal view of a portion of a leadframe 10 prior to the forming of any leads. As discussed below, leadframe 10 will be used as a starting material in the manufacture of package assembly 70 in accordance with the present invention, which is illustrated in final form in FIG. 5.

Leadframe 10 is a portion of a leadframe rail to be used in the formation of a single package. Leadframe 10 has edges 12 and 14 and is patterned to provide in-plane leads 16 and offset leads 18, which will be formed to have an offset in a later manufacturing step. A dam bar 20, as is conventional, connects in-plane leads 16. Leadframe 10 also includes a mounting substrate or flag 22 to be used later for supporting a semiconductor die. Substrate 22 is connected to leadframe 10 by tabs 24.

It should be appreciated that all of the leads and other portions of leadframe 10 in FIG. 1 are illustrated in a single common leadframe plane. These elements are in a common plane because leadframe 10 is illustrated prior to the forming of any leads or mounting substrate 22 to have an offset outside of or away from this common plane. As used herein "common plane" will in general refer to that original plane corresponding to the plane of leadframe 10 in FIG. 1 prior to a forming operation.

In a typical manufacturing process, including that discussed below, portions of leadframe 10, such as offset leads 18 and mounting substrate 22, will be bent or formed to have portions disposed outside of the common plane. However, certain portions of, for example, leads 18 will remain in the common plane after being bent or formed. For example, the top portion of offset leads 18 shown in FIG. 5 are disposed in the same common plane as the top portions of in-plane leads 16 because these top portions were never bent out of this common plane during manufacture.

FIGS. 2 and 3 are cross-sectional views illustrating sequential stages in the manufacture of package assembly 70 of FIG. 5 using the planar leadframe of FIG. 1. Particularly, FIG. 2 illustrates the leadframe of FIG. 1 after at least one of the leads is offset from the leadframe plane.

Referring now to FIG. 2, according to a preferred embodiment of the present invention, offset lead 18 is formed to have a bend 31 and a bend 30 and is offset from the original leadframe plane by a distance indicated as internal lead offset 32. Also, mounting substrate 22 has been down-set out of the common plane and remains connected to leadframe 10 by tabs 24. The forming process used to bend lead 18 and to down-set mounting substrate 22 can be conventional. The location of bend 30 along lead 18 is above the position of dam bar 20 (see FIG. 1) so that an internal portion of offset lead 18 that is offset from the common plane of leadframe 10 will be inside the package to later be formed around leadframe 10.

FIG. 3 illustrates the next stage of manufacture in which an electronic component such as a semiconductor die or device 40 has been, for example, attached to substrate 22 using a conventional die-bonding process and electrically connected to leads 16 using wire bonds 42 formed by, for example, conventional wire-bonding. In this particular embodiment, leads 16 and 18 are separated by an external lead offset 50, which, in the preferred embodiment, corresponds to internal lead offset 32. However, in other embodiments, external lead offset 50 could be different from internal lead offset 32. Leads 16 and 18 have tips 52 and 54 which will be bent in a later stage. Conventional trimming of leadframe 10 has been done as necessary.

It should be appreciated that FIGS. 3–5 illustrate an embodiment of package assembly 70 in which die 40 and wire bonds 42 are substantially fully encapsulated by package 44 in a single molding step such as by transfer or injection molding. In this embodiment, wire bonds 42 are made to leads 16 only, but in other embodiments wire bonds 42 could also be made to one or more offset leads 18. Also, minor portions of tabs 24, dam bar 20, and other small portions of leadframe remaining after conventional trimming are not shown in FIGS. 3–5 for simplicity of illustration.

After forming package 44, each of leads 16 and 18 can be described as having an internal portion 46 and an external portion 48. Internal portion 46 is that portion of a lead disposed inside of package 44, which provides rigidity to such internal portions. External portion 48 is that portion of a lead disposed outside of package 44.

Because leads 18 are offset from leads 16 by internal lead offset 32, and because this offset is disposed inside package 44, the mechanical strength of package 44 provides significant support to internal portion 46 of leads 18. Thus, external portion 48 of lead 18 can be of a shorter length and still provide an offset mechanical support to increase the mechanical rigidity of package assembly 70 (as shown in FIG. 4). According to the preferred embodiment of the present invention, by providing bend 30 of lead 18 inside the boundary of package 44, the rigidity of package assembly 70 when finally mounted will be significantly increased.

FIG. 4 is a cross-sectional view of the package assembly of FIG. 5 in a final manufactured state. In this embodiment, the external portions of leads 16 and 18 are formed to provide bends 64 after package 44 has been formed. This external forming process can be conventional and provides bases 60 and 62 of leads 16 and 18 that will be used to surface mount package assembly 70 to, for example, a printed circuit board 66. Such vertical surface mounting of package 44 will dispose die 44 in a substantially vertical orientation relative to printed circuit board 66. In other embodiments, package 44 could be mounted using a different approach such as, for example, through-hole mounting of leads 16 and 18 or, for example, leads 16 and 18 can be formed to one side of the package.

FIG. 5 is an isometric view of package assembly 70 in a final manufactured state. Portions of package 44 are not shown to better illustrate leads 16 and 18.

An embodiment using a so-called over-molded package 44 has been discussed above. However, the present invention is also applicable to other types of packaging in addition to the over-molded package above. For example, a conventional pre-molded (e.g., open cavity) package could be formed by injection molding to cover portions of leads 16 and 18 and portions of leadframe 10 prior to attaching die 40 to substrate 22. In such a pre-molded process, die 40 could be attached after forming the pre-molded package followed by wire-bonding. Finally, the remainder of the package around die 40 could be formed by first covering die 40 with, for example, a silicone die coat followed by a conventional thermoset liquid encapsulant material. Regardless of the package type selected, the lead formation process for providing an internal offset for at least one lead is generally the same. Also, the type of package formation process used is not critical. For example, transfer molding, injection molding, and glob top encapsulation may be used with the present invention.

As used herein, the term "package" is intended to generally mean the one or several materials used to substantially fully encapsulate die 40, wire bonds 42, and the portions of leadframe 10 proximate to die 40. For example, in the case of a pre-molded package as discussed above, the term "package" would include the silicone die coat and glob top material used to complete the encapsulation of die 40. However, one of skill in the art will recognize that for certain types of electronic components such as chemical and pressure sensors, some type of access port or ports are required for the active element of the sensor to interact with the media being sensed. The presence of such ports when applicable is not intended to vary the general meaning of "package" as discussed herein.

A significant advantage of package assembly 70 according to the present invention is that it provides a resonant frequency for package assembly 70 greater than about 2,000 Hertz (Hz). The resonant frequency can be adjusted by varying the length of external lead offset 50. Resonant frequency for a package containing an electronic component is discussed in more detail in U.S. Pat. No. 5,659,950, by Adams et al., issued on Aug. 26, 1997, and commonly assigned to Motorola, which is hereby incorporated by reference in full. By providing an offset to lead 16, the frequency at which package assembly resonates can be increased to 2,000 Hz or greater. Thus, package assembly 70 provides a way to mount an accelerometer that will not be adversely affected by lower frequency vibrations as created by an automobile. In addition to the decrease in surface area required to surface mount the package or the need for external supports, another significant advantage to the package assembly 70 is that the thickness of leadframe 10 can be minimized to achieve equivalent resonant frequencies had no offset bend been incorporated.

The present invention is also useful for other types of electronic components sensitive to vibration, which may include certain chemical, pressure, or optical sensors. Also, because of the rigidity provided by package assembly 70 along with its smaller footprint and vertical surface mounting, package assembly 70 can be used with many discrete products in general that need to withstand a vibratory environment.

FIGS. 2–5 illustrate a preferred embodiment of the present invention in which leads 18 project or protrude from package 44 offset from and generally parallel to leads 16. Increased rigidity and improved vertical stability of a package assembly in accordance with the present invention over known package assemblies is due to offsetting at least one lead from a plane defined by the unformed lead frame and particularly, to internal offset 32. Lead 18 is offset from the common plane and from lead 16 as a result of bend 31. In the preferred embodiment, bend 30 and bend 31 of leads 18 are formed internal to package 44. As noted herein, providing bend 30 internal to package 44 further increases the rigidity and improves the vertical stability of package assembly 70. In accordance with the preferred embodiment, bend 30 provides an approximately constant offset between leads 16 and 18 external to package 18.

Figure 6:
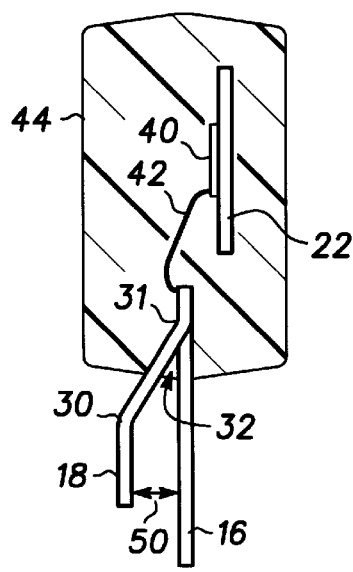
FIGS. 6 and 7 are cross-sectional views of a package assembly for an electronic component during manufacture according to alternate embodiments of the present invention.
Figure 7:
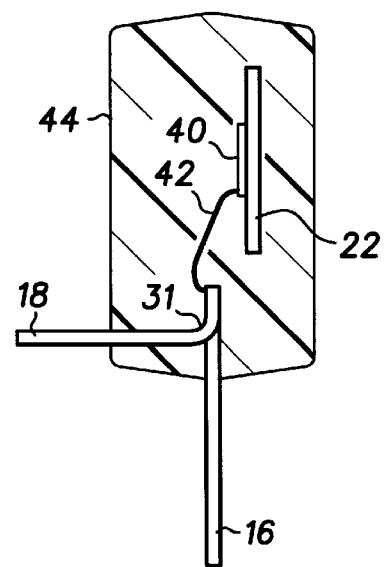

FIGS. 6 and 7 illustrate cross-sectional views of a package assembly for an electronic component during manufacture according to alternate embodiments of the present invention. In accordance with an alternate embodiment of the present invention, leads 16 and 18 project from package 44 in a generally non-parallel manner. Lead 18 is offset from lead 16 and the common plane due to internal bend 31.

In accordance with the present invention, bend 31 is formed in lead 18 such that lead 18 is offset from the common plane, forming an angle defined by lead 18 and the common plane. For example, referring to FIG. 6, bend 31 directs leads 18 away from leads 16 causing leads 18 to project from package 44 offset from leads 16 and forming a varying internal offset 32. If desired, leads 18 may be formed to have bend 30 external to package 44 and provide a relatively constant external offset. Alternatively, leads 18 can form varying offset with leads 16 by the amount of bend in bend 30 or by not including a bend 30.

Referring to FIG. 7 for exemplary purposes, in accordance with an alternate embodiment of the present invention, this angle can be such that lead 18 projects or protrudes from package 44 at one side while leads 16 project from package 44 at another side. To facilitate vertical mounting required in some sensor applications, that portion of lead 18 external to package 44 may be further formed, such as including a bend 30 external to package 44 (not shown).

Increased rigidity and improved vertical stability for the alternate embodiments, such as those of FIGS. 6 and 7, are provided by offset 32 internal to package 44. Internal bend 31 produces internal offset 32 and results in lead 18 projecting from package 44 offset from the plane defined by the unformed lead frame and from lead 16. As with the preferred embodiment, because leads 18 are offset from leads 16 by internal lead offset 32, and because this offset is disposed inside package 44, the mechanical strength of package 44 provides significant support to internal portion 46 of leads 18. Accordingly, while forming bend 30 internal to package 44 further enhances the package assembly of the present invention, bend 30 may be formed external to package 44 or omitted without departing from the principles of the present invention.

Final manufacturing of the alternate embodiments may be performed as discussed above. For example, leads 18 and 16 can be formed to have bend 64 and bases 60 and 62. Further, it should be understood that the present invention is not limited to offsetting a particular lead or leads from the common plane; the position of the offset lead or leads of the lead frame is not critical as the first, second, third, and so on, or combinations thereof can be offset in accordance with the present invention.

By now, it should be appreciated that there has been provided a novel package assembly for encapsulating and mounting an electronic component. The package assembly has an internal portion of an offset lead inside the package so that the extent of post-encapsulation forming required is minimized and handling of the packages is easier. The offset lead increases the resonant frequency of the package assembly and provides good vertical stability when vertically surface mounting the package.

The foregoing discussion discloses and describes merely exemplary methods and embodiments of the present invention. As will be understood by those familiar with the art, the invention may be embodied in other specific forms without departing from the spirit or essential characteristics thereof. Accordingly, the disclosure of the present invention is intended to be illustrative, but not limiting, of the scope of the invention, which is set forth in the following claims.

We claim:

1. A vertical mount semiconductor device comprising:
   an open cavity, surface mount package;
   a mounting substrate disposed inside the package;
   a sensor die attached to the mounting substrate;
   a first and a second lead partially disposed inside the package and non-integral with the mounting substrate, wherein the first and second lead each protrude from the package; and
   a third and fourth lead partially disposed inside the package and non-integral with the mounting substrate, wherein the third and fourth lead each protrude from the package;
   wherein a portion of the first and second leads internal to the package is coplanar with a portion of the third and fourth leads internal to the package; and
   wherein the first and second lead are non-coplanar with the third and fourth lead where each protrude from the package.

2. The device of claim 1 wherein, external to the package, an end the first lead and an end of the second lead being bent in an opposing direction to an end of the third lead and an end of the fourth lead for surface mounting of the vertical mount semiconductor device.

3. A method of manufacturing a semiconductor device comprising a housing having a plurality of leads protruding from said housing wherein said plurality of leads comprise a first lead, a second lead, a third lead, and a fourth lead, the method comprising the steps of:
   forming the first lead, the second lead, the third lead, and the fourth lead from a common lead frame such that a portion of the first lead and a portion of the second lead are offset from a common plane corresponding to the third lead and the fourth lead;
   attaching a sensor die to a flag of the common lead frame;
   forming the housing such that a portion of the plurality of leads is disposed inside the housing and such that the first lead and the second lead protrude from the housing offset from the common plane corresponding to the third lead and the fourth lead;
   bending an external portion of the first lead disposed outside the housing in a first direction; and
   bending an external portion of the third lead disposed outside the housing in a second direction; the first direction and the second direction being opposing directions.

4. The method of claim 3 wherein the step of forming the housing comprises the step of forming an open cavity housing and wherein the step of attaching the sensor die is performed after forming the open cavity housing.

5. The method of claim 3 wherein the step of forming the leads is performed prior to the step of attaching the sensor die.

6. A method of manufacturing a package assembly for an electronic component comprising the steps of:
   forming from a common lead frame a first lead, a second lead, and a third lead such that a portion of the first lead and a portion of the second lead are offset from a common plane corresponding to the common lead frame and offset from the third lead;
   forming an open cavity package about the first lead, the second lead, and the third lead such that a first portion of the leads is internal to the package and a second portion of the leads is external to the package and such that the first lead and the second lead protrude from the package offset from the common plane and offset from the third lead.

7. The method of claim 6 further comprising the step of attaching a semiconductor die to a mounting substrate disposed within the open cavity package.

8. The method of claim 7 further comprising the step of electrically coupling the semiconductor die to at least one of the first lead, the second lead, and the third lead.

* * * * *